(12) United States Patent
Hong

(10) Patent No.: US 7,659,738 B2
(45) Date of Patent: Feb. 9, 2010

(54) TEST SOCKETS HAVING PELTIER ELEMENTS, TEST EQUIPMENT INCLUDING THE SAME AND METHODS OF TESTING SEMICONDUCTOR PACKAGES USING THE SAME

(75) Inventor: Jun-Pyo Hong, Seoull (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/017,202

(22) Filed: Jan. 21, 2008

(65) Prior Publication Data
US 2008/0174333 A1 Jul. 24, 2008

(30) Foreign Application Priority Data
Jan. 22, 2007 (KR) .................. 10-2007-0006644

(51) Int. Cl.
*G01R 31/02* (2006.01)

(52) U.S. Cl. .................... 324/760; 324/755

(58) Field of Classification Search .......... 324/754–765
See application file for complete search history.

(56) References Cited

U.S. PATENT DOCUMENTS

| | | | | |
|---|---|---|---|---|
| 4,839,587 A | * | 6/1989 | Flatley et al. | 324/761 |
| 5,006,796 A | * | 4/1991 | Burton et al. | 324/760 |
| 5,164,661 A | * | 11/1992 | Jones | 324/760 |
| 6,181,145 B1 | * | 1/2001 | Tomita et al. | 324/754 |
| 6,919,734 B2 | * | 7/2005 | Saito et al. | 324/760 |
| 7,495,458 B2 | * | 2/2009 | McClanahan et al. | 324/754 |

FOREIGN PATENT DOCUMENTS

| | | |
|---|---|---|
| JP | 02-001577 | 1/1990 |
| KR | 1020000049746 A | 8/2000 |
| KR | 200334395 | 11/2003 |

* cited by examiner

*Primary Examiner*—Ernest F Karlsen
(74) *Attorney, Agent, or Firm*—F. Chau & Associates, LLC

(57) ABSTRACT

A test socket includes a socket body in which a semiconductor package is located, a socket head combined with the socket body, a Peltier element in the socket head, and power terminals connected to the Peltier element. A test equipment includes the test socket and a method of testing the semiconductor package uses the test socket.

12 Claims, 4 Drawing Sheets

TEST SOCKETS HAVING PELTIER ELEMENTS, TEST EQUIPMENT INCLUDING THE SAME AND METHODS OF TESTING SEMICONDUCTOR PACKAGES USING THE SAME

CROSS-REFERENCE TO RELATED APPLICATION

This U.S. non-provisional patent application claims priority under 35 U.S.C § 119 of Korean Patent Application 2007-6644, filed on Jan. 22, 2007, the entirety of which is hereby incorporated by reference.

BACKGROUND

The present disclosure relates to test sockets having Peltier elements, test equipment including the same, and methods of testing semiconductor packages using the same.

In general, semiconductor chips may be sorted into either good chips or failed chips through a wafer level test process. The semiconductor chips may be employed in various electronic systems that process or store a number of accurate data. Accordingly, the wafer level test process may correspond to a very important process for evaluating the reliability and quality of the semiconductor chips. The wafer level test process may be applied to a small quantity of semiconductor chips in a development stage, whereas the wafer level test process may also be applied to a large quantity of semiconductor chips in a mass production stage.

The semiconductor chips may be packaged to produce semiconductor packages that are encapsulated by protection material such as epoxy resin, and the semiconductor packages may also be classified into either good semiconductor packages or failed semiconductor packages through a package level test process. Each of the semiconductor packages may be inserted into a socket on a test module substrate during the package level test process and then removed from the socket after the package level test process. When the package level test process is performed at room temperature, it may be difficult to regard the test results as reliable data even though the semiconductor packages under the test substantially have excellent characteristics. This is because characteristics of the semiconductor packages may be changed according to an environmental temperature. In other words, even though the semiconductor packages exhibit excellent characteristics at room temperature, the semiconductor packages may malfunction at a higher or lower temperature than the room temperature.

In fact, the semiconductor packages may be exposed to diverse environments during operation thereof. Thus, the test processes including the package level test process should be performed under various conditions to evaluate whether the semiconductor packages operate correctly in various environments. For example, a temperature test or a high-voltage stress (HVS) test may be performed in order to evaluate the reliability of the semiconductor packages. The temperature test may comprise a high-temperature test and a low-temperature test.

In general, the high-temperature test may be performed using a variable temperature generator after testing various characteristics of the semiconductor packages at room temperature. A conventional variable temperature generator has a large volume, however, and it is difficult to carry the conventional variable temperature generator. Further, it may take a long time to test a small quantity of semiconductor packages using the conventional variable temperature generator.

In order to perform the high-temperature test, the conventional variable temperature generator may provide heated air on the socket in which the semiconductor package is mounted. Thus, the socket and the semiconductor package are indirectly heated up and the high-temperature test may be then performed. For example, once the variable temperature generator is set for a desired temperature, the variable temperature generator heats the air and the heated air is provided onto the socket and the semiconductor package. Therefore, the socket and the semiconductor package may be heated up to maintain the desired temperature. After testing the semiconductor package at the desired temperature, the operation of the variable temperature generator is stopped and the tested semiconductor package is replaced with another semiconductor package. Accordingly, whenever a new semiconductor package is tested, extra time is required to produce the re-heated air. As a result, throughput of the test set-up using the variable temperature generator may be degraded.

SUMMARY OF THE INVENTION

Exemplary embodiments of the present invention are directed to test sockets having Peltier elements, test equipment including the same, and methods of testing semiconductor packages using the same. In an exemplary embodiment, the test socket comprises a socket body in which a semiconductor package is located, a socket head combined with the socket body, a Peltier element in the socket head, and power terminals connected to the Peltier element.

In exemplary embodiments, the socket head may comprise a plate disposed between the Peltier element in the socket head and the semiconductor package in the socket body. The plate between the Peltier element and the semiconductor package may comprise a thermal conductive material. The socket head may comprise a plurality of openings. In an exemplary embodiment, the openings may be uniformly arrayed in a top plate of the socket head. The socket head may further comprise a central opening that penetrates a central portion of the socket head.

In exemplary embodiments, the test socket may further comprise a temperature sensor that is disposed to be adjacent the semiconductor package.

In an exemplary embodiment, the test equipment comprises a test unit having a test socket in which a semiconductor package is located, a temperature sensing unit connected to the test unit to indicate a temperature of the semiconductor package, and a control unit connected to the temperature sensing unit to control the test unit. The test socket comprises a socket body in which the semiconductor package is located, a socket head combined with the socket body, a Peltier element in the socket head, and power terminals connected to the Peltier element.

According to an exemplary embodiment, the method comprises i) providing a test socket having a socket body, a socket head disposed on the socket body to combine with the socket body, a Peltier element in the socket head and power terminals connected to the Peltier element, ii) inserting a semiconductor package into the socket body, iii) applying a first voltage to the power terminals to generate heat from the Peltier element, the heat from the Peltier element being conducted to the semiconductor package, iv) operating the semiconductor package, v) testing the semiconductor package, and vi) replacing the semiconductor package with a new semiconductor package.

In exemplary embodiments, the method may further comprise sequentially and repeatedly performing the steps iv) to vi) set forth hereinabove.

In exemplary embodiments, the method may further comprise applying a second voltage to the power terminals to cool down the semiconductor package after the step v) set forth hereinabove, and wherein the second voltage has an opposite polarity to the first voltage.

According to exemplary embodiments, the socket head may be provided to have a thermal conductive material plate disposed between the semiconductor package in the socket body and the Peltier element in the socket head, and may be provided to have a plurality of openings.

BRIEF DESCRIPTION OF THE DRAWINGS

Exemplary embodiments of the present invention will be understood in more detail from the following descriptions taken in conjunction with the attached drawings.

DETAILED DESCRIPTION OF EXEMPLARY EMBODIMENTS

The present invention will now be described more fully hereinafter with reference to the accompanying drawings, in which exemplary embodiments of the invention are shown. This invention, however, may be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like numbers refer to like elements throughout the drawings.

Figure 1:
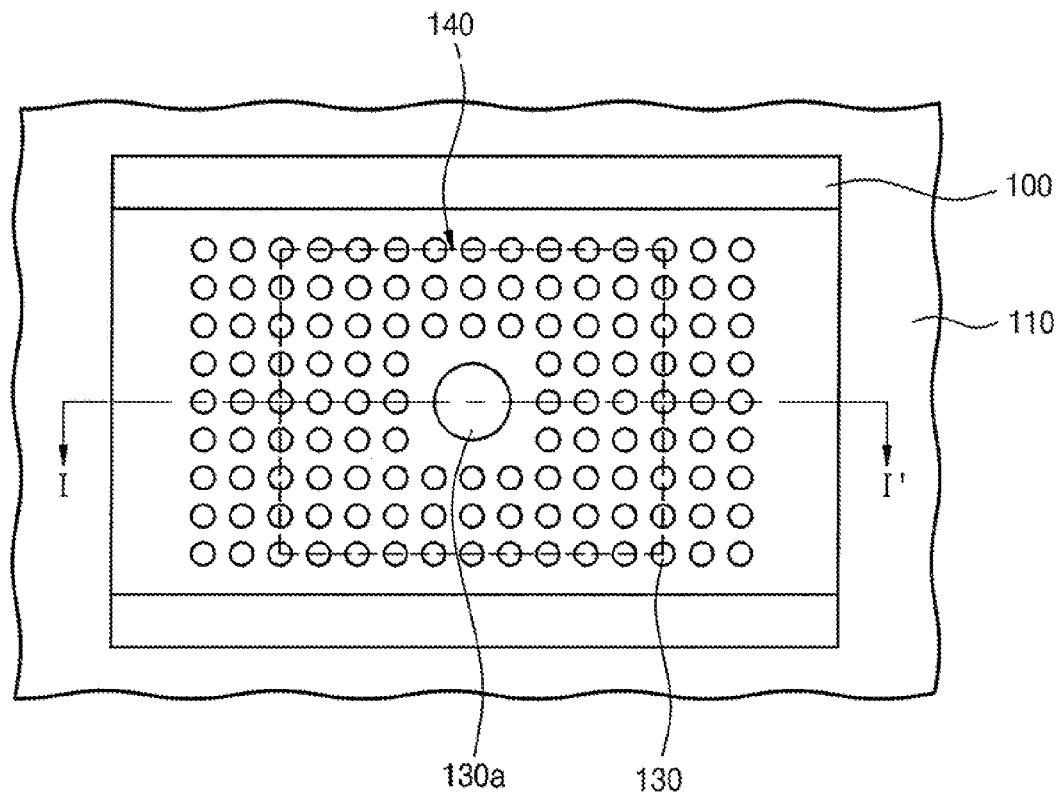
FIG. 1 is a plan view illustrating a test socket according to an exemplary embodiment of the present invention.
Figure 2:
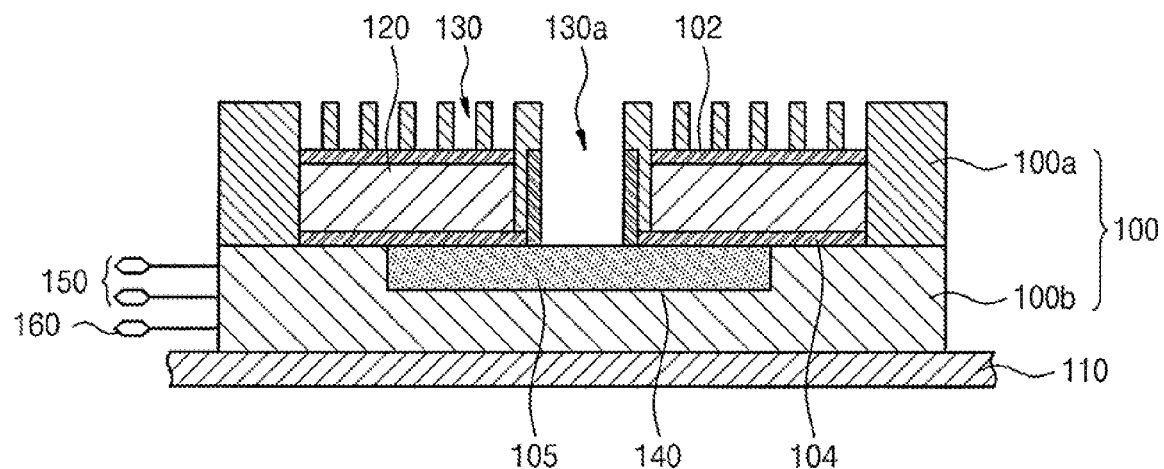
FIG. 2 is a cross sectional view taken along the line I-I' in the socket of FIG. 1.

FIG. 1 is a plan view illustrating a test socket according to an exemplary embodiment of the present invention, and FIG. 2 is a cross sectional view taken along the line I-I' of the socket shown in FIG. 1.

Referring to FIGS. 1 and 2, a socket 100 for testing a semiconductor chip is provided. The socket 100 may be mounted on a socket board 110. The socket 100 may be a fine ball grid array (FBGA) socket.

The socket 100 may comprise a socket head 100a and a socket body 100b. A Peltier element 120 may be installed in the socket head 100a. The semiconductor chip may be encapsulated to provide a semiconductor package 105, and the socket body 100b may include a chip region 140 in which the semiconductor package 105 is located. The chip region 140 may be disposed to be adjacent the Peltier element 120.

The socket head 100a may be removably attached to the socket body 100b and subsequently detached from the socket body 100b. That is, the socket head 100a is attachable and detachable to/from the socket body 100b. When the socket head 100a is attached to the socket body 100b, the socket head 100a may be firmly affixed to the socket body 100b by a fastening system (not shown).

Hereinafter, the Peltier element 120 will be described with reference to FIGS. 1 to 3.

Figure 3:
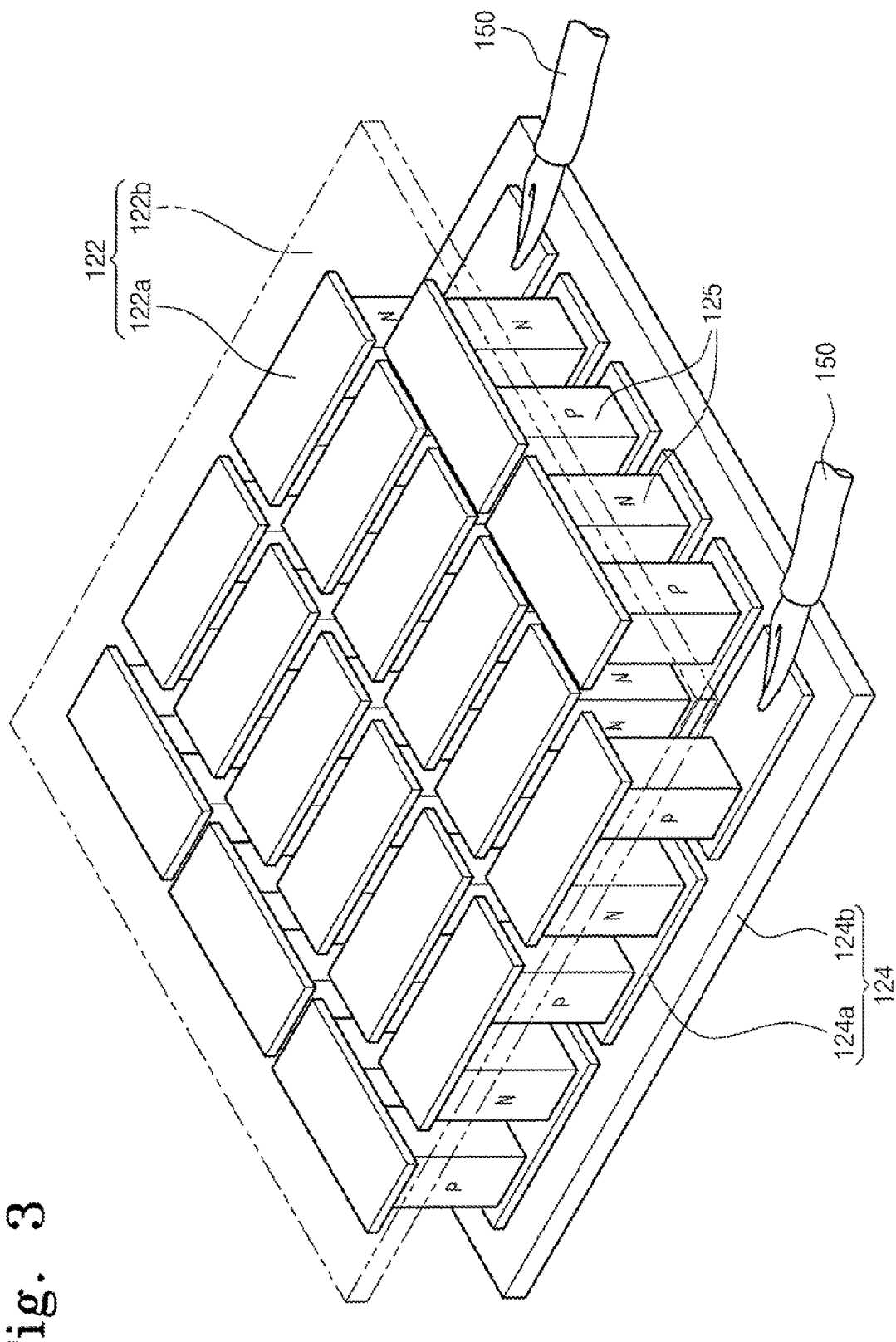
FIG. 3 is a perspective view illustrating a Peltier element employed in a test socket according to an exemplary embodiment of the present invention.

Referring to FIGS. 1 to 3, the Peltier element 120 may comprise a top plate 122, a bottom plate 124, and a plurality of semiconductors 125 disposed between the top plate 122 and the bottom plate 124. The semiconductors 125 may comprise P-type semiconductors and N-type semiconductors. The top plate 122 may comprise a first ceramic plate 122b and a plurality of first metal plates 122a attached to a lower surface of the first ceramic plate 122b. Similarly, the bottom plate 124 may comprise a second ceramic plate 124b and a plurality of second metal plates 124a attached to an upper surface of the second ceramic plate 124b. In this exemplary embodiment, the plurality of semiconductors 125 may be disposed between the first metal plates 122a and the second metal plates 124a, and the semiconductors 125 may be electrically connected in series through the first and second metal plates 122a and 124a. That is, the P-type semiconductor and the N-type semiconductor may be alternately and repeatedly arrayed to constitute a series circuit.

The top plate 122 of the Peltier element 120 may be in contact with a top plate 102 of the socket head 100a shown in FIG. 2, and the bottom plate 124 of the Peltier element 120 may be in contact with a bottom plate 104 of the socket head 100a shown in FIG. 2. The top plate 102 and the bottom plate 104 may comprise a thermal conductive material, so that heat generated from the Peltier element 120 can be easily conducted through the top plate 102 or the bottom plate 104. More specifically, the bottom plate 104 may conduct the heat from the Peltier element 120 to the semiconductor package 105 shown in FIG. 2.

A pair of power terminals 150 may be connected to both ends of the Peltier element 120, respectively. When a constant power voltage is applied to the power terminals 150, a direct current may flow through the Peltier element 120. In this exemplary embodiment, one of the top plate 122 and the bottom plate 124 may be heated up, and the other may be cooled down. For example, when a positive polarity of the power voltage is applied to the power terminal 150 connected to the P-type semiconductor, the bottom plate 124 may be heated up and the top plate 122 may be cooled down. In contrast, when a positive polarity of the power voltage is applied to the power terminal 150 connected to the N-type semiconductor, the top plate 122 may be heated up and the bottom plate 124 may be cooled down. Accordingly, it is possible to test a semiconductor chip, for example, the semiconductor package 105, at either a high temperature or a low temperature using the socket 100 that includes the Peltier element 120. A Peltier effect element described above is well known in the art. Thus, detailed descriptions of the operation principles of the Peltier element 120 will not be developed further.

A temperature sensor 160 may be installed at the bottom plate 104 of the socket head 100a, thereby sensing the heat that is conducted to the semiconductor package 105. When the semiconductor package 105 is excessively heated over a specific temperature, the semiconductor package 105 may be damaged so as to ultimately cause a malfunction. Thus, if the temperature sensor 160 indicates a high temperature over a desired temperature, it can prevent the semiconductor package 105 from being excessively heated up by reducing the power voltage applied to the Peltier element 120 by the power terminals 150.

A plurality of openings 130 are provided in an upper portion of the socket head 100a to expose the top plate 102 of the socket head 100a, or to expose a surface of the Peltier element 120. The openings 130 may be uniformly arrayed. Each of the openings 130 may have the same or different configurations. A central opening 130a may be additionally provided to penetrate a central portion of the socket head 100a. In this exemplary embodiment, the bottom plate 104 of the socket head 100a may extend upward and along a sidewall of the central opening 130a. Thus, the heat generated from the Peltier element 120 may be efficiently radiated through the openings 130 or the central opening 130a. As a result, the openings 130 and the central opening 130a may prevent the semiconductor package 105 from being degraded due to the accumulation of heat generated from the Peltier element 120 during the test process.

Figure 4:
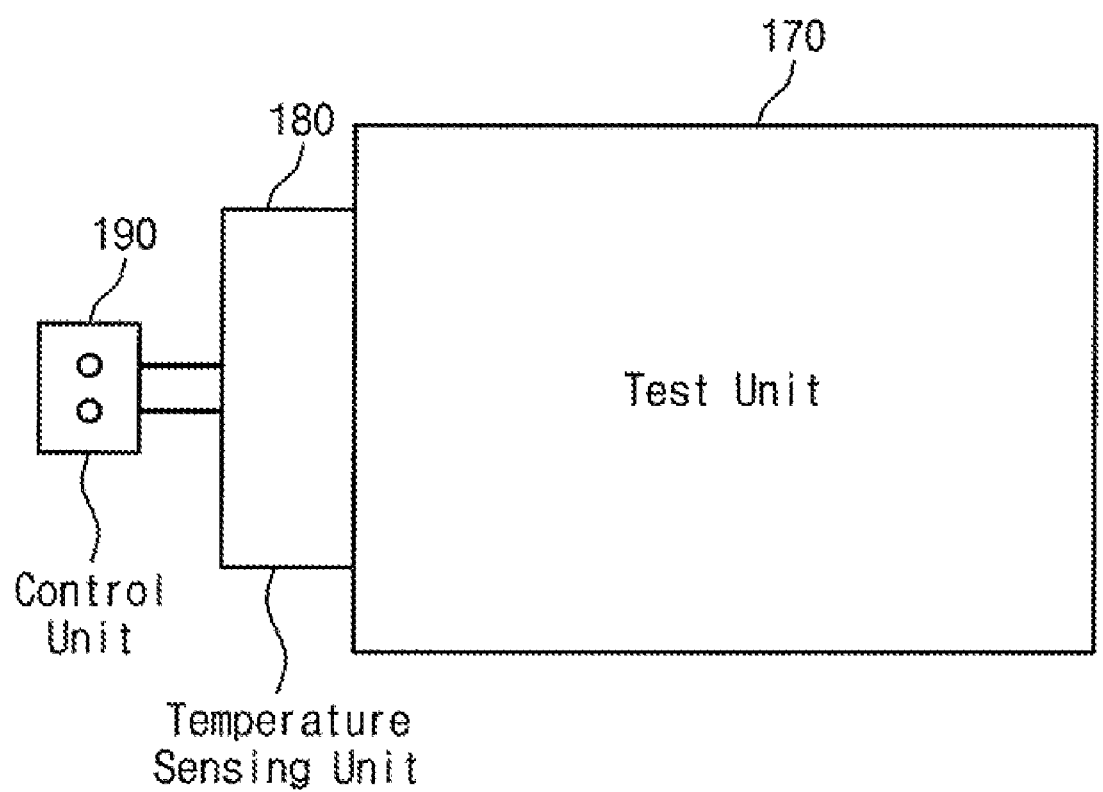
FIG. 4 is a schematic block diagram illustrating a semiconductor test equipment including a test socket according to an exemplary embodiment of the present invention.

FIG. 4 is a schematic block diagram illustrating a semiconductor test equipment including a test socket according to an exemplary embodiment of the present invention.

Referring to FIG. 4, the semiconductor test equipment according to an exemplary embodiment of the present invention comprises a test unit 170, a temperature sensing unit 180, and a control unit 190. The test unit 170 includes the test socket described with reference to FIGS. 1 to 3 and a socket driver (not shown) for operating the test socket. The temperature sensing unit 180 may be connected to the test unit 170, and the control unit 190 may be connected to the temperature sensing unit 180.

When a power voltage is applied to power terminals of the test socket in the test unit 170, one of the top and bottom plates of the Peltier element installed in the test socket may be heated up and the other plate of the top and bottom plates of the Peltier element may be cooled down. If the heated plate is in contact with the semiconductor package mounted in the test socket, a temperature of the semiconductor package may be increased to reach a desired high temperature. The temperature of the semiconductor package may be indicated on the temperature sensing unit 180. In the event that the semiconductor package is excessively heated to a temperature above the desired high temperature, the control unit 190 may decrease the power voltage to lower the temperature of the semiconductor package.

Now, methods of testing a semiconductor chip, for example, the semiconductor package, using a test socket according to an exemplary embodiment of the present invention are described with reference to FIGS. 2 and 5.

Figure 5:
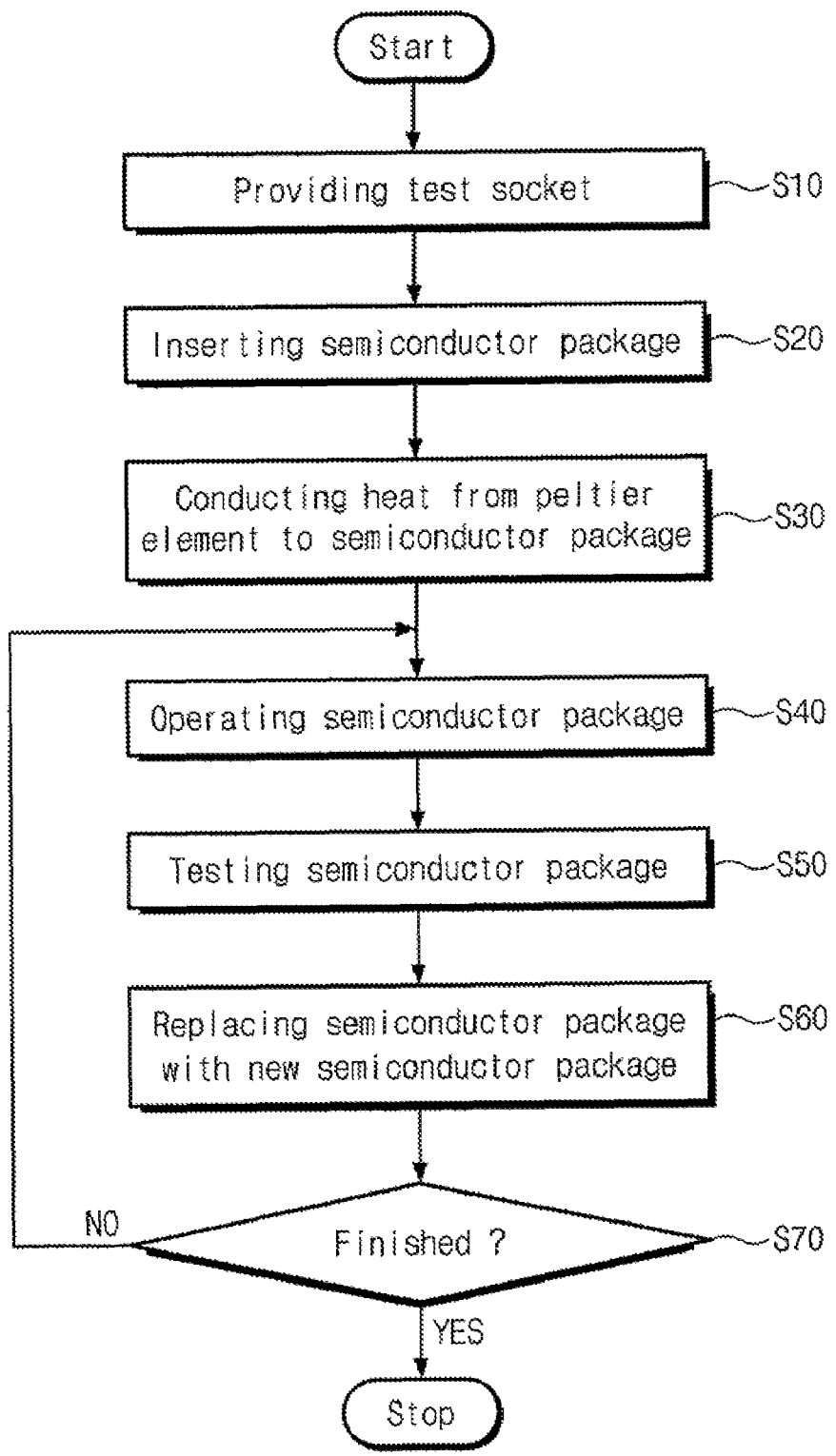
FIG. 5 is a flow chart illustrating methods of testing a semiconductor package using a test socket according to an exemplary embodiment of the present invention.

Referring to FIGS. 2 and 5, a test socket 100 is provided (step S10 of FIG. 5). A semiconductor package 105 is inserted into the test socket 100 having a socket body 100b and a socket head 100a disposed on the socket body 100b (step S20 of FIG. 5). In order to insert the semiconductor package 105 into the test socket 100, the socket head 100a is lifted up to open the test socket 100 and the semiconductor package 105 may be located in a chip region 140 of the socket body 100b. The socket head 100a may be then moved down to close the test socket 100 after the semiconductor package 105 is loaded into the chip region 140.

A power voltage is applied to a Peltier element 120 in the test socket 100 to conduct heat from the Peltier element 120 to the semiconductor package 105 (step S30 of FIG. 5). As a result, the semiconductor package 105 is heated up to a desired high temperature. The semiconductor package 105 may be then operated by electrical signals that are output from a socket board 110 attached to the socket body 110b (step S40 of FIG. 5).

Various characteristics of the semiconductor package 105 may be tested and evaluated at the desired high temperature during operation of the semiconductor package 105 (step S50 of FIG. 5). Accordingly, a high temperature test may be performed.

When the test procedure described above is finished, the semiconductor package 105 that has been tested may be replaced with a new semiconductor package (step S60 of FIG. 5). In order to replace the semiconductor package 105 with the new semiconductor package, the socket head 100a may be lifted up and the semiconductor package 105 in the socket body 100b removed. In this exemplary embodiment, the power voltage may be still applied to the Peltier element even after the socket head 100a is lifted up. Thus, the Peltier element may continuously generate heat. The new semiconductor package may be inserted into the socket body 100b after removal of the semiconductor package 105, and the socket head 100a is moved down to close the test socket 100. Therefore, the new semiconductor package may be rapidly heated up and tested at the desired high temperature without any time delay caused by waiting for the Peltier element to heat up again. As a result, the test time may be reduced, thereby to improve the throughput of the test socket, as compared to the conventional art.

The control unit 190 may determine whether the test procedure described above is additionally required or not after replacing the semiconductor package 105 with the new semiconductor package (step S70 of FIG. 5). If the test is not completely finished, the steps S40 to S60 described above may be sequentially and repeatedly performed. Otherwise, the test process may be stopped.

When a low-temperature test is required, the low-temperature test may be accomplished by changing the polarity of the power voltage applied to the Peltier element. Thus, the high-temperature test as well as the low-temperature test may be successively performed using the single test socket 100. The low-temperature test may be performed before or after the step S60 illustrated in FIG. 5.

According to the aforementioned exemplary embodiments, a test socket for testing a semiconductor package at various temperatures includes a Peltier element arranged therein. A power voltage may be continuously applied to the Peltier element to generate heat even while the semiconductor package is being replaced with a new semiconductor package. Thus, the new semiconductor package may be rapidly heated up and tested without any time delay. As a result, the test time may be reduced, thereby to improve the throughput of the test socket. In addition, the test socket may include openings that expose at least one of a top plate and a bottom plate adjacent to the Peltier element. Thus, even though the Peltier element may continuously generate heat, the openings may prevent the semiconductor package from being excessively heated up. Therefore, a reliable temperature test may be efficiently performed without any degradation of the semiconductor package.

Although the present invention has been described in connection with the exemplary embodiments of the present invention illustrated in the accompanying drawings, it is not limited thereto. It will be apparent to those of ordinary skill in the art that various substitutions, modifications and changes may be made without departing from the scope and spirit of the invention.

What is claimed is:

1. A test socket comprising:
   a socket body in which a semiconductor package is located;
   a socket head combined with the socket body to confine the semiconductor package, the socket head including a plurality of openings and a central opening that penetrates a central portion of the socket head;
   a Peltier element arranged in the socket head adjacent the semiconductor package; and
   power terminals connected to the Peltier element.

2. The test socket as set forth in claim 1, wherein the socket head comprises a plate disposed between the Peltier element in the socket head and the semiconductor package in the socket body, and wherein the plate between the Peltier element and the semiconductor package comprises a thermal conductive material.

3. The test socket as set forth in claim 1, wherein the openings are uniformly arrayed in a top plate of the socket head.

4. The test socket as set forth in claim 1, further comprising a temperature sensor disposed to be adjacent the semiconductor package.

5. A method of testing a semiconductor package, the method comprising:
   i) providing a test socket having a socket body, a socket head disposed on the socket body for combination with the socket body, a Peltier element in the socket head, and power terminals connected to the Peltier element, the socket head including a plurality of openings and a central opening that penetrates a central portion of the socket head;
   ii) inserting a semiconductor package into the socket body so as to be confined therein by the socket head;
   iii) applying a first voltage to the power terminals to generate heat from the Peltier element, the heat from the Peltier element being conducted to the semiconductor package;
   iv) operating the semiconductor package;
   v) testing the semiconductor package; and
   vi) replacing the semiconductor package that has been tested with a new semiconductor package to be tested.

6. The method as set forth in claim 5, further comprising sequentially and repeatedly performing the steps iv) to vi).

7. The method as set forth in claim 5, further comprising applying a second voltage to the power terminals to cool down the semiconductor package after the step v), wherein the second voltage has an opposite polarity to the first voltage.

8. The method as set forth in claim 5, wherein the socket head is provided to have a thermal conductive plate disposed between the semiconductor package in the socket body and the Peltier element in the socket head.

9. A test equipment comprising:
   a test unit having a test socket in which a semiconductor package is located;
   a temperature sensing unit connected to the test unit to indicate a temperature of the semiconductor package; and
   a control unit connected to the temperature sensing unit to control the test unit,
   wherein the test socket comprises:
   a socket body in which the semiconductor package is located;
   a socket head combined with the socket body so as to confine the semiconductor package, the socket head including a plurality of openings and a central opening that penetrates a central portion of the socket head;
   a Pettier element arranged in the socket head to be adjacent the semiconductor package; and
   power terminals connected to the Peltier element.

10. The test equipment as set forth in claim 9, wherein the socket head comprises a plate disposed between the Pettier element in the socket head and the semiconductor package in the socket body, and wherein the plate between the Peltier element and the semiconductor package comprises a thermal conductive material.

11. The test equipment as set forth in claim 9, wherein the plurality of openings are uniformly arrayed in a top plate of the socket head.

12. The test equipment as set forth in claim 9, further comprising a temperature sensor disposed in the socket body to be adjacent the semiconductor package.

* * * * *